(12) United States Patent
Strauβ

(10) Patent No.: US 9,671,089 B2
(45) Date of Patent: Jun. 6, 2017

(54) CONVERSION ELEMENT AND ILLUMINANT

(71) Applicant: OSRAM Opto Semiconductors GmbH, Regensburg (DE)

(72) Inventor: Uwe Strauβ, Bad Abbach (DE)

(73) Assignee: OSRAM OPTO SEMICONDUCTOR GMBH, Regensburg (DE)

( * ) Notice: Subject to any disclaimer, the term of this patent is extended or adjusted under 35 U.S.C. 154(b) by 76 days.

(21) Appl. No.: 14/380,931

(22) PCT Filed: Feb. 22, 2013

(86) PCT No.: PCT/EP2013/053558
§ 371 (c)(1),
(2) Date: Aug. 25, 2014

(87) PCT Pub. No.: WO2013/127702
PCT Pub. Date: Sep. 6, 2013

(65) Prior Publication Data
US 2015/0003042 A1 Jan. 1, 2015

(30) Foreign Application Priority Data

Feb. 29, 2012 (DE) ........................ 10 2012 101 663

(51) Int. Cl.
*F21K 99/00* (2016.01)
*G02B 5/02* (2006.01)
(Continued)

(52) U.S. Cl.
CPC ................ *F21V 13/14* (2013.01); *F21V 7/05* (2013.01); *F21V 7/22* (2013.01); *F21V 9/16* (2013.01);
(Continued)

(58) Field of Classification Search
CPC .............................. F21V 13/14; G02B 5/0294
See application file for complete search history.

(56) References Cited

U.S. PATENT DOCUMENTS 5,183,323 A * 2/1993 Daniel ................ B29C 47/0019
362/556
6,653,765 B1 11/2003 Levinson et al.
(Continued)

FOREIGN PATENT DOCUMENTS

CN 101120453 A 2/2008
CN 102057507 A 5/2011
(Continued)

*Primary Examiner* — Jong-Suk (James) Lee
*Assistant Examiner* — Eric T Eide
(74) *Attorney, Agent, or Firm* — McDermott Will & Emery LLP

(57) ABSTRACT

A conversion element (10) is specified, comprising a scattering layer (12), a reflection layer (14), and a conversion layer (16) arranged between the scattering layer (12) and the reflection layer (14). The scattering layer (12) is designed to transmit a first portion (20) of a primary radiation (18) impinging on it from a side facing away from the conversion layer (16) into the conversion layer (16), and to scatter a second portion (22) of the primary radiation (18) impinging on it towards that side of the scattering layer (12) which faces away from the conversion layer (16). The conversion layer (16) comprises at least one conversion means (25) which is designed to convert at least part of the first portion of the primary radiation (18) into a second radiation (19) having a higher wavelength different from the primary radiation (18). The reflection layer (14) has a reflective effect at least with regard to the second radiation (19).

6 Claims, 6 Drawing Sheets

(51) Int. Cl.
    *G02B 5/136*     (2006.01)
    *F21V 13/14*     (2006.01)
    *F21V 7/05*     (2006.01)
    *F21V 9/16*     (2006.01)
    *F21V 7/22*     (2006.01)
    *H01L 33/44*     (2010.01)
    *H01L 33/50*     (2010.01)
    *F21Y 115/30*     (2016.01)
    *F21Y 115/10*     (2016.01)

(52) U.S. Cl.
    CPC ......... *G02B 5/0242* (2013.01); *G02B 5/0289* (2013.01); *G02B 5/0294* (2013.01); *G02B 5/136* (2013.01); *F21Y 2115/10* (2016.08); *F21Y 2115/30* (2016.08); *H01L 33/44* (2013.01); *H01L 33/507* (2013.01); *H01L 2933/0091* (2013.01)

(56) References Cited

U.S. PATENT DOCUMENTS

| | | | |
|---|---|---|---|
| 7,394,188 B2 * | 7/2008 | Ouderkirk | H01L 33/507 313/110 |
| 8,637,883 B2 * | 1/2014 | Chakraborty | H01L 33/44 257/100 |
| 9,273,830 B2 * | 3/2016 | Negley | F21K 9/00 |
| 2006/0291238 A1 * | 12/2006 | Epstein | G02B 6/0055 362/600 |
| 2008/0198572 A1 | 8/2008 | Medendorp | |
| 2009/0272996 A1 * | 11/2009 | Chakraborty | H01L 33/501 257/98 |
| 2011/0175518 A1 * | 7/2011 | Reed | F21V 7/05 313/483 |
| 2011/0280004 A1 * | 11/2011 | Shimada | G02B 3/0056 362/97.1 |
| 2012/0118381 A1 * | 5/2012 | Debije | G02B 6/004 136/259 |
| 2012/0200801 A1 * | 8/2012 | Wheatley | G02B 6/005 349/61 |
| 2013/0279151 A1 * | 10/2013 | Ouderkirk | H01L 33/507 362/84 |
| 2014/0111968 A1 | 4/2014 | Lee | |

FOREIGN PATENT DOCUMENTS

| | | |
|---|---|---|
| DE | 3887709 T2 | 6/1994 |
| DE | 102007037875 A1 | 2/2009 |
| DE | 102008012316 A1 | 4/2009 |
| DE | 102008030253 A1 | 12/2009 |
| JP | H1096804 A | 4/1998 |
| JP | 2000193803 A | 7/2000 |
| JP | 2002138114 A | 5/2002 |
| JP | 2003110146 A | 4/2003 |
| JP | 2005347263 A | 12/2005 |
| JP | 2008108553 A | 5/2008 |
| JP | 2008129509 A | 6/2008 |
| JP | 2009098615 A | 5/2009 |
| JP | 2009160755 A | 7/2009 |
| JP | 2010-186873 A | 8/2010 |
| JP | 2010537420 A | 12/2010 |
| JP | 2011071404 A | 4/2011 |
| JP | 2011517029 A | 5/2011 |
| JP | 2011519149 A | 6/2011 |
| WO | WO-2009024952 A2 | 2/2009 |
| WO | WO-2011012545 A1 | 2/2011 |

* cited by examiner

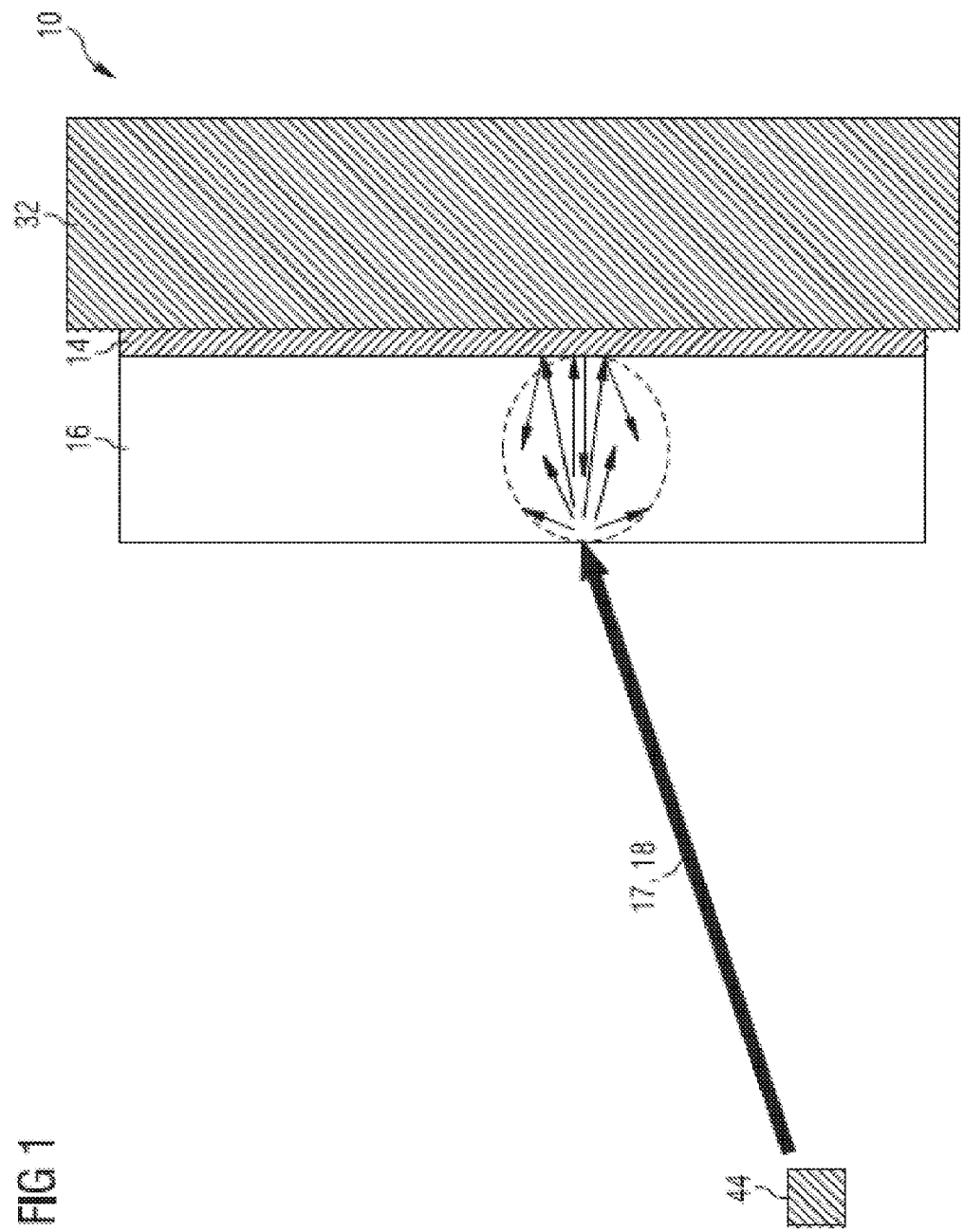

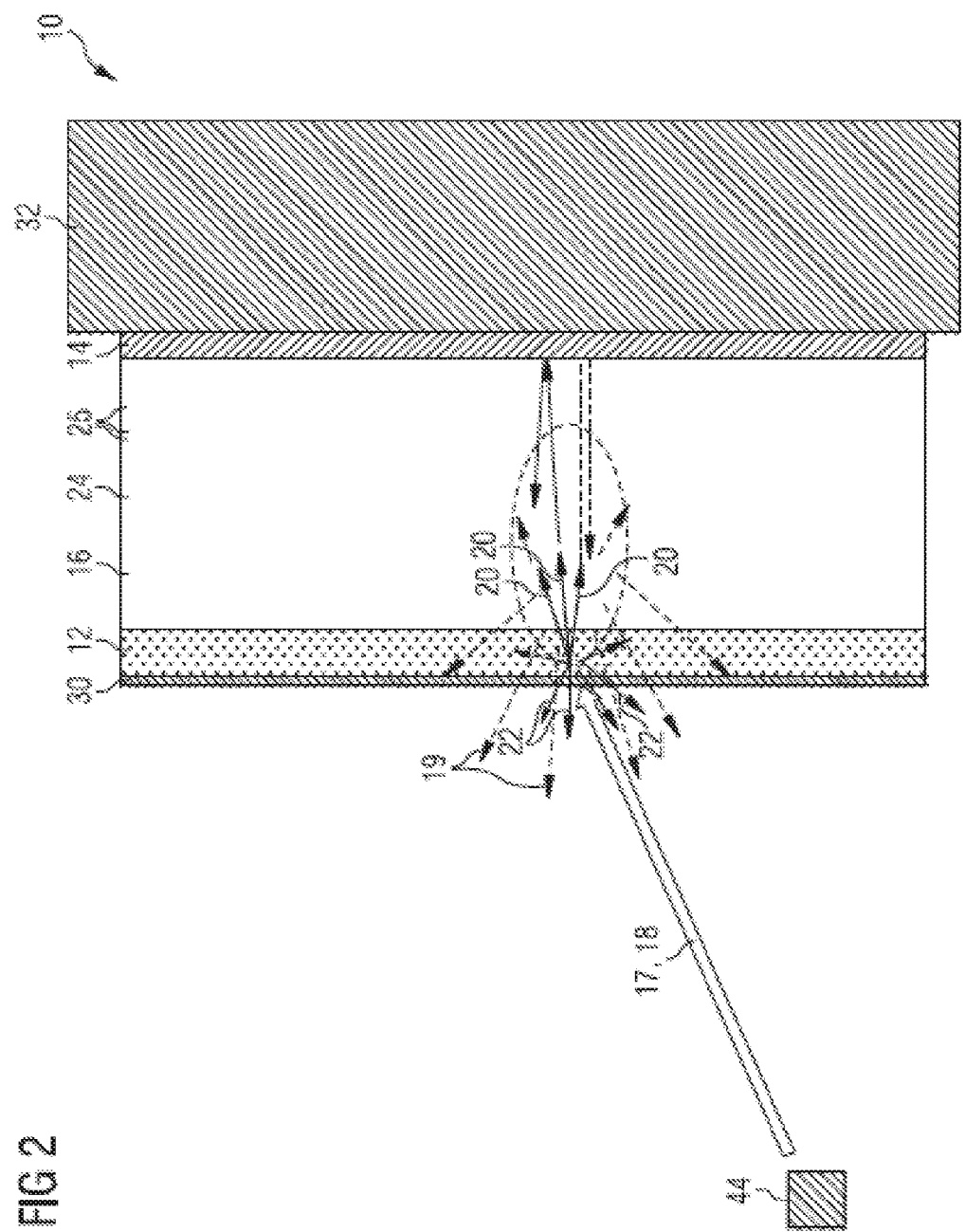

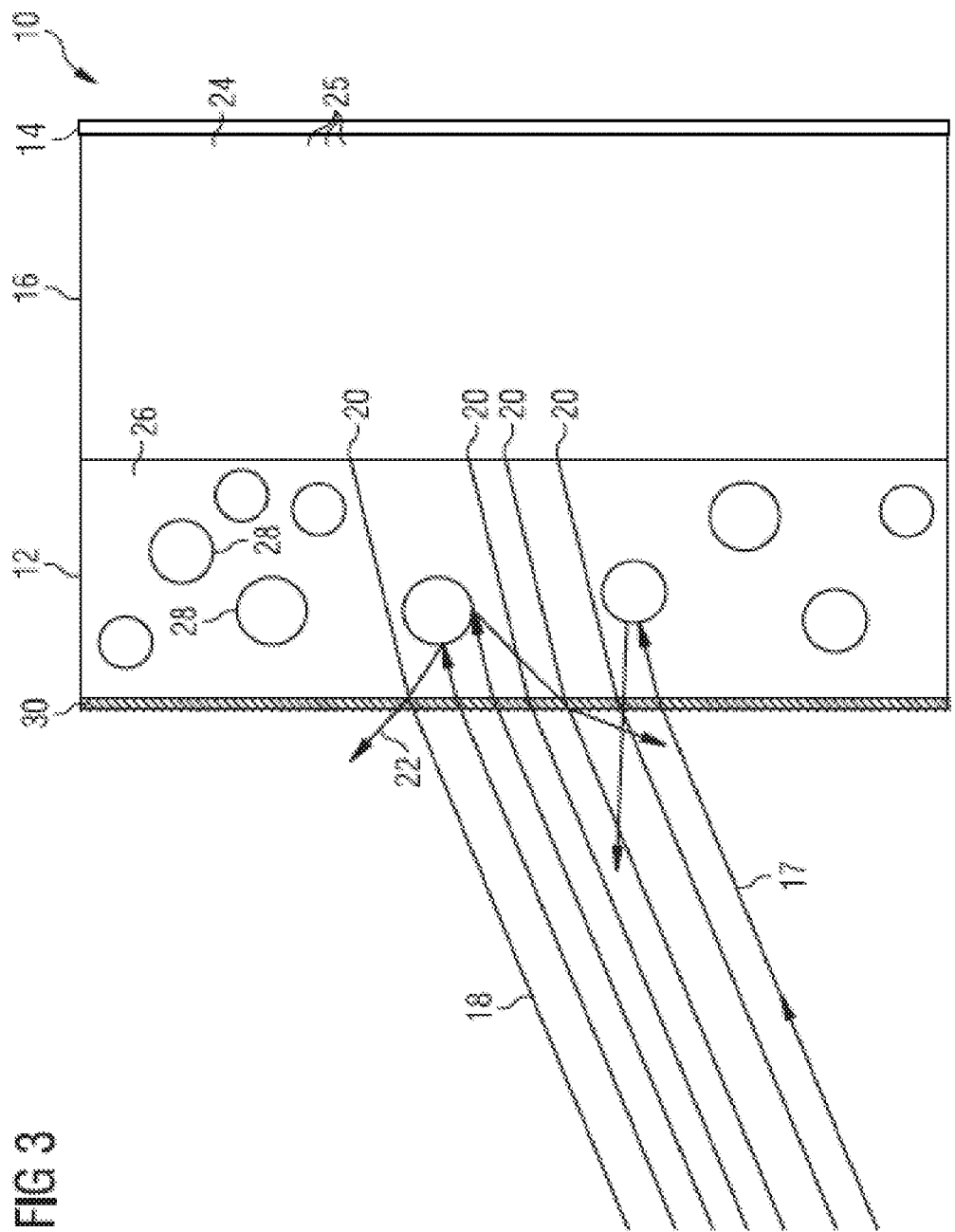

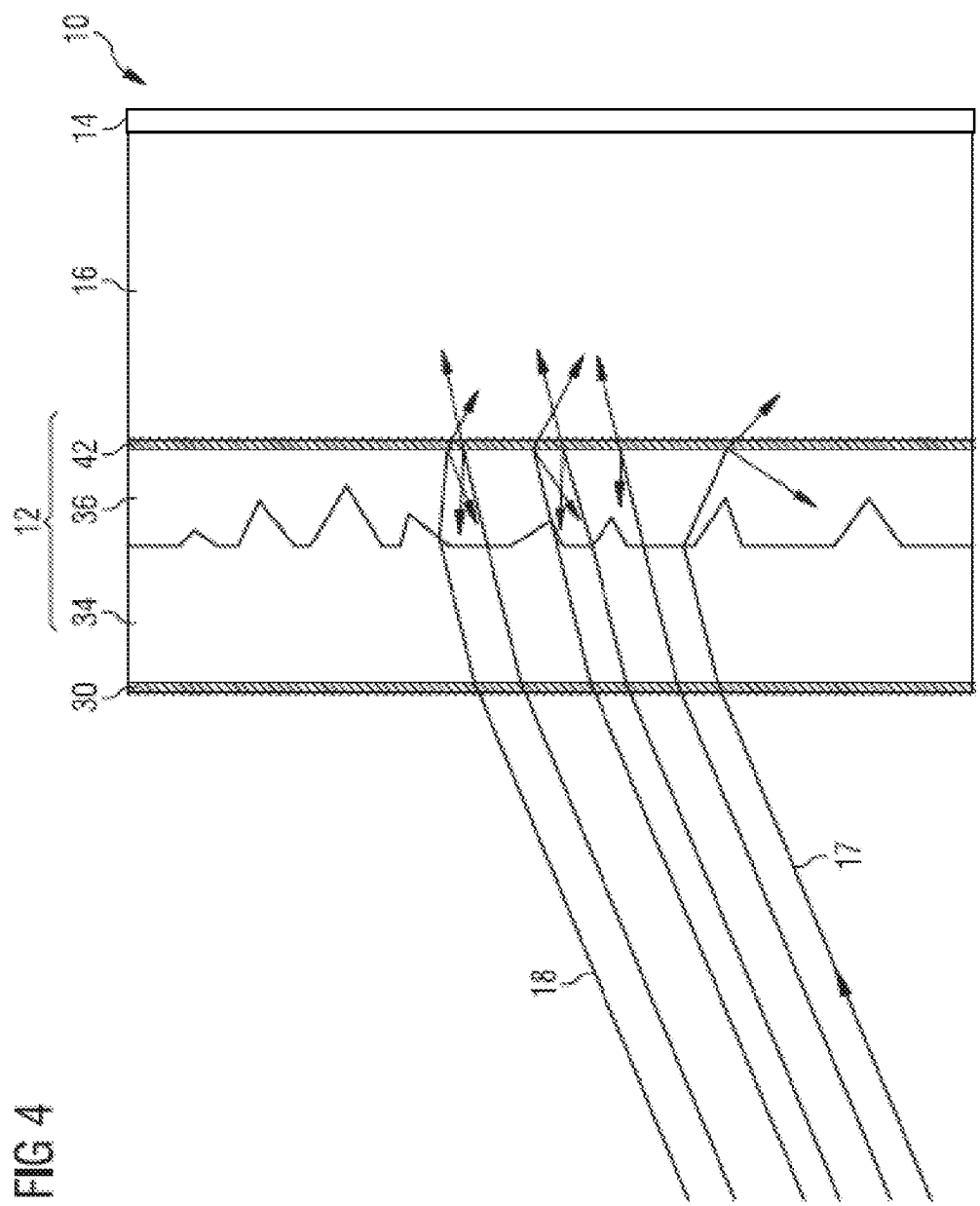

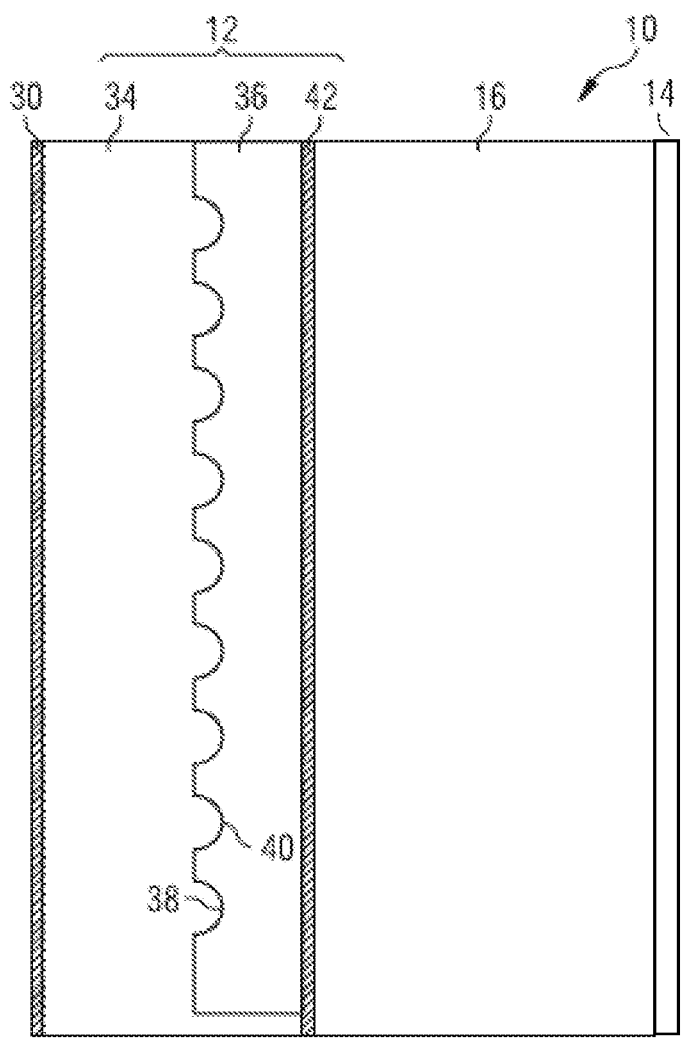

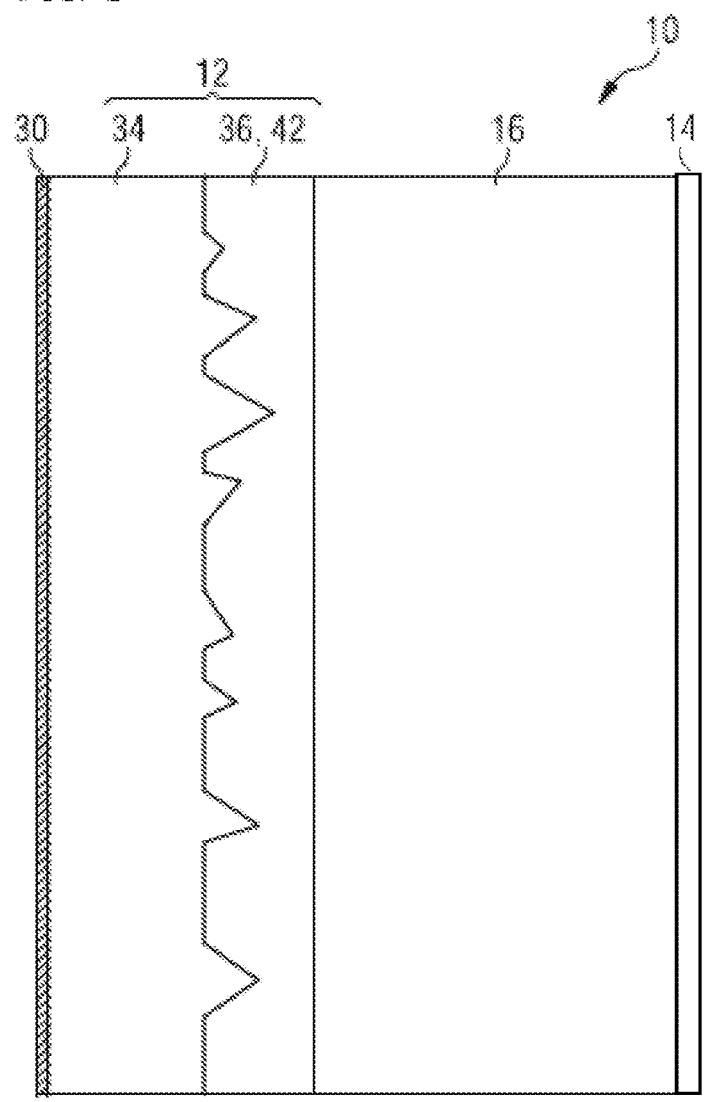

CONVERSION ELEMENT AND ILLUMINANT

A conversion element and an illuminant are specified.

This patent application claims the priority of German Patent Application 10 2012 101 663.1, the disclosure content of which is hereby incorporated by reference.

Light having a specific wavelength or in a specific spectral range is required for many applications. However, many light sources, in particular semiconductor-based light sources such as light-emitting diodes or laser diodes, emit light only in a spectral range deviating therefrom or at discrete wavelengths. Therefore, it is often desired to convert the light emitted by the light source at least partly into light having a different wavelength. This conversion takes place, for example, by means of organic or inorganic luminescent substances. In the case of these luminescent substances, the conversion is usually based on the principle of so-called down-conversion. That is to say that light in the blue spectral range, for example, is absorbed and red-shifted light having a lower frequency with respect thereto is emitted. In other words, high-energy light radiation is converted by the luminescent substance into light radiation of lower energy and into non-radiative energy, in particular into heat. Finally, a non-converted portion of the high-energy light radiation can be mixed with the converted light radiation of lower energy, such that white light, for example, is generated.

What is disadvantageous is that the luminescent substances heat up and the conversion efficiency is reduced as a result. Secondly, during the production of such light sources, problems arise as a result of insufficiently accurate color locus control, which results from the fact that a fluctuation of the thickness of the conversion layer or differences in the concentration of the converter in the embedding matrix produce(s) a fluctuation of the ratio between lower-frequency and higher-frequency light.

In some instances, the thermal problems can be solved by setting a suitable distance between the radiation-generating semiconductor chip and the conversion element, wherein the conversion material is embedded into a matrix having good thermal conductivity (e.g. ceramic).

FIG. 1 shows such a conversion element from the prior art, which is designated overall by 10. A semiconductor chip 44 configured as a laser diode emits a primary radiation for example having a wavelength of between 400 nm and 485 nm inclusive (blue or violet light), which passes along an incidence direction 17 and impinges on the conversion element 10. A conversion layer 16 is applied to a heat sink having a mirror 14. The converter concentration and the thickness of the conversion layer 16 are set such that part of the primary radiation 18 emerges again on the front side of the conversion element 10. A mixture of primary radiation and converted secondary radiation having a higher wavelength different from the primary radiation 18, for example of red light, is generated as a result. In the arrangement shown in FIG. 1, however, the problem of color locus control is amplified since the double ray passages increase the influence of variations in the thickness and concentration of the converter.

One object to be achieved is to specify a conversion element which overcomes the disadvantages mentioned above. A further object to be achieved is to specify an illuminant comprising such a conversion element.

This object is achieved by an object in accordance with the independent patent claim.

Advantageous embodiments and developments of the object are characterized in the dependent claims and are furthermore evident from the following description and the drawings.

In accordance with at least one embodiment of the conversion element, the conversion element comprises a scattering layer, a reflection layer, and a conversion layer arranged between the scattering layer and the reflection layer.

In this case, the conversion layer can be arranged directly between the scattering layer and the reflection layer, or else only indirectly, i.e. for example further layers can also be provided between the conversion layer, on the one hand, and the scattering layer or the reflection layer, on the other hand. The same correspondingly applies hereinafter to the term "arranged on a layer".

In accordance with at least one embodiment of the conversion element, the scattering layer is designed to transmit a first portion of a primary radiation impinging on it from a side facing away from the conversion layer into the conversion layer, and to scatter a second portion of the primary radiation impinging on it toward that side of the scattering layer which faces away from the conversion layer. "Scattering" means here that the primary radiation originating from the side facing away from the conversion layer from a first solid angle range and impinging on the conversion layer is deflected into a second solid angle range toward that side of the scattering layer which faces away from the conversion layer, wherein the second solid angle range is greater than the first solid angle range and the primary radiation is thus expanded. In particular, the primary radiation can impinge on the conversion layer along a specific incidence direction and can be deflected into a finite, sufficiently large solid angle range. The mechanism which brings about the deflection of the primary radiation can vary greatly in this case. In particular, the deflection can be effected by small structures in the conversion layer which act as Lambertian emitters, or alternatively by a plurality of reflective or light-refracting partial areas arranged in the conversion layer and having different orientations, which produce different reflection or light-refraction directions in a location-dependent manner in the conversion layer.

In this case, "primary radiation" can mean both electromagnetic radiation having one wavelength or in a first wavelength range which is to be converted, and electromagnetic radiation having a plurality of wavelengths or in a plurality of wavelength ranges.

By way of example, the primary radiation can be electromagnetic radiation having a single wavelength. The scattering layer is then designed to transmit a first portion of a primary radiation having this wavelength and impinging on it from a side facing away from the conversion layer into the conversion layer, and to scatter a second portion of the primary radiation impinging on it, said second portion having the same wavelength, toward that side of the scattering layer which faces away from the conversion layer.

On the other hand, the primary radiation can comprise for example, electromagnetic radiation having a first wavelength and a second wavelength different therefrom. In this case, the scattering layer can be designed to transmit a first portion of a primary radiation impinging on it from a side facing away from the conversion layer, said first portion comprising electromagnetic radiation having either both wavelengths or only the first wavelength, into the conversion layer, and to scatter a second portion of the primary radiation impinging on it, said second portion comprising electromagnetic radiation having either both wavelengths or only the second wavelength, toward that side of the scattering layer which faces away from the conversion layer. Such an embodiment has the advantage that a color locus of the (for example white) light generated by the mixing of the scattered primary radiation and the secondary radiation can be controlled by the variation of a ratio of the intensities of the electromagnetic radiation of the two wavelengths with respect to one another.

In accordance with at least one embodiment of the conversion element, the conversion layer comprises at least one conversion means. The conversion means is designed to convert at least part of the first portion of the primary radiation into a secondary radiation having a higher wavelength different from the primary radiation.

The conversion layer can also contain a matrix material, for example a silicone or a ceramic, in which the at least one conversion means is embedded. In this case, the matrix material can act as a binder. The matrix material can preferably be transmissive for the electromagnetic radiation in a relevant spectral range. In this case, "relevant spectral range" means both electromagnetic radiation having a wavelength or in a first wavelength range which is to be converted (that is to say the primary radiation) and electromagnetic radiation having a wavelength or in a wavelength range which results from the conversion (that is to say the secondary radiation).

The conversion means can be an inorganic luminescent substance based on down-conversion. Preferably, the conversion means is formed with a cerium- or europium-doped luminescent substance. The efficiency of the conversion can depend on the temperature; in particular, the efficiency can decrease as the temperature rises. The conversion means has the form of a powder, for example. In the same way as the matrix material, in the relevant spectral range the conversion means is resistant to photodamage.

In accordance with at least one embodiment of the conversion element, the conversion layer contains a ceramic material or is formed by a layer composed of a ceramic material which comprises a ceramic conversion substance which acts as the conversion means.

The ceramic conversion substance can for example comprise at least one or more of the following materials for conversion or be formed from one or more of the following materials: garnets doped with rare earth metals, alkaline earth metal sulfides doped with rare earth metals, thiogallates doped with rare earth metals, aluminates doped with rare earth metals, silicates, such as orthosilicates, doped with rare earth metals, chlorosilicates doped with rare earth metals, alkaline earth metal silicon nitrides doped with rare earth metals, oxynitrides doped with rare earth metals, and aluminum oxynitrides doped with rare earth metals, silicon nitrides doped with rare earth metals, sialons.

In preferred embodiments, in particular garnets, for instance yttrium aluminum oxide (YAG), lutetium aluminum oxide (LuAG) and terbium aluminum oxide (TAG), can be used as the ceramic conversion substance.

In further preferred embodiments, the materials for the ceramic conversion substance are doped for example with one of the following activators: cerium, europium, neodymium, terbium, erbium, praseodymium, samarium, manganese. Cerium-doped yttrium aluminum garnets, cerium-doped lutetium aluminum garnets, europium-doped orthosilicates and europium-doped nitrides shall be mentioned purely by way of example for possible doped ceramic conversion substances.

In accordance with at least one embodiment of the conversion element, the reflection layer has a reflective effect at least with regard to the secondary radiation. As a result, the secondary radiation is directed into a solid angle range toward that side of the scattering layer which faces away from the conversion layer.

It is preferred for both the scattered portion of the primary radiation and the secondary radiation in each case to cover a sufficiently large solid angle range toward this side of the scattering layer which faces away from the conversion layer. It is furthermore preferred for the solid angle range of the scattered portion of the primary radiation to greatly overlap the solid angle range of the secondary radiation, and ideally to correspond thereto.

In accordance with at least one embodiment of the conversion element, provision is made for the conversion layer to be designed to convert the entire primary radiation impinging on it or at least more than 95% thereof into the secondary radiation. This can be achieved by a suitable concentration of the conversion means or by a sufficient layer thickness of the conversion layer.

In accordance with at least one embodiment of the conversion element, provision is made for the scattering layer to contain a matrix material in which a plurality of scattering elements are embedded. If primary radiation impinges on the plurality of scattering elements along a specific incidence direction, then scattered rays are generated which are emitted into a finite, sufficiently large solid angle range toward that side of the scattering layer which faces away from the conversion layer.

In accordance with at least one embodiment of the conversion element, provision is made for the scattering elements to be reflection-coated, for example with a metal such as silver.

In accordance with at least one embodiment of the conversion element, provision is made for an average size of the scattering elements to be greater than a wavelength of the primary radiation. As a result, radiation lobes are obtained principally counter to an incidence direction of the primary radiation.

In accordance with at least one embodiment of the conversion element, provision is made for an antireflection layer to be arranged on that side of the scattering layer which faces away from the conversion layer. The suppression of a directional reflective primary radiation is achieved as a result.

In accordance with at least one embodiment of the conversion element, provision is made for a heat sink to be arranged on that side of the reflection layer which faces away from the conversion layer.

In accordance with at least one embodiment of the conversion element, provision is made for the reflection layer to be arranged with its side facing away from the conversion layer on a thermally conductive carrier or for the reflection layer to be formed by a reflective coating of a thermally conductive carrier.

In accordance with at least one embodiment of the conversion element, provision is made for the scattering elements to be embodied in a spherical fashion.

In accordance with at least one embodiment of the conversion element, provision is made for the scattering elements to have a refractive index which differs from that of the matrix material of the scattering layer. In this regard, by way of example, the difference in the optical refractive index between scattering elements and matrix material can be greater than or equal to 0.1, preferably greater than or equal to 0.2, in particular greater than or equal to 0.4.

In accordance with at least one embodiment of the conversion element, provision is made for the scattering layer to comprise a first and a second partial layer having mutually different refractive indices, wherein the interface between the first and second partial layers is roughened or the first and second partial layers have mutually complementary structurings.

In accordance with at least one embodiment of the conversion element, provision is made for at least one of the structurings to be embodied in a comb-like fashion.

In accordance with at least one embodiment of the conversion element, provision is made for the scattering layer to comprise a wavelength-selective mirror layer, which has a partly reflective effect for the primary radiation and a transmissive effect for the secondary radiation. By way of example between 10% and 50% of the intensity of the primary radiation can be reflected by the wavelength-selective mirror layer.

In the case where the primary radiation comprises electromagnetic radiation having a first wavelength and a second wavelength different therefrom, the wavelength-selective mirror layer can be designed in such a way that it has a transmissive effect for the first portion of the primary radiation, said first portion comprising only electromagnetic radiation having the first wavelength, and has a reflective effect for the second portion of primary radiation, said second portion comprising only electromagnetic radiation having the second wavelength.

In accordance with at least one embodiment of the conversion element, provision is made for the wavelength-selective mirror layer to be arranged between the second partial layer and the conversion layer.

In accordance with at least one embodiment of the conversion element, the wavelength-selective mirror layer has a plurality of partial areas which are inclined with respect to a main extension plane of the wavelength-selective mirror layer and form a plurality of different angles therewith. With regard to said angles, the partial areas can be distributed statistically over the entire main area, but they can also have a well-defined angular distribution dependent on the position on the main extension plane. Typically, the average size of the partial areas is much smaller than the diameter of that region of the wavelength-selective mirror layer on which the primary radiation impinges.

If primary radiation impinges on an area structured in this way along a specific incidence direction, then reflection rays are generated which are emitted into a finite, sufficiently large solid angle range toward that side of the scattering layer which faces away from the conversion layer. Consequently, the wavelength-selective mirror layer acts as a scattering layer in accordance with the definition mentioned above.

If the incidence direction in this case forms an angle α with the main extension plane of the wavelength-selective mirror layer, then it is preferred for the plurality of different angles of the partial areas to be distributed symmetrically around the angle α/2. In this way, the scattered primary radiation has an intensity distribution that is symmetrical around the normal to the main extension plane of the wavelength-selective mirror layer.

Furthermore, an illuminant is specified.

In accordance with at least one embodiment, the illuminant comprises at least one conversion element in accordance with one or more of the embodiments mentioned above and at least one semiconductor chip which can be configured as a laser diode, as a light-emitting diode or as a luminescence diode, wherein radiation emitted by the semiconductor chip reaches the conversion element at least in part and the radiation emitted by the semiconductor chip can be converted at least in part into a radiation having a lower frequency, for instance by means of down-conversion. Such an illuminant can be operated with high optical powers.

In accordance with at least one embodiment of the illuminant, the semiconductor chip is designed to emit a primary radiation having a wavelength of between 400 nm and 485 nm inclusive, which impinges on the conversion element.

In accordance with at least one embodiment of the illuminant, semiconductor chip and conversion element are spatially separated from one another. Semiconductor chip and conversion element can be arranged on a common heat sink, for example, but can have a spatial distance with respect to one another. This is possible, in particular, if the semiconductor chip is configured as a laser diode and the light emitted by the laser diode is guided to the conversion element for instance in a free-running manner over a certain section. Since laser light, in particular, can be collimated very well, semiconductor chip and conversion element can be spaced apart from one another significantly further than would be possible in the case of a light-emitting diode. By way of example, semiconductor chip and conversion element are at least five millimeters apart from another, preferably at least ten millimeters. By means of the spatial separation of semiconductor chip and conversion element, a thermal decoupling of the two components from one another can also be effected.

In accordance with at least one embodiment of the illuminant, the optoelectronic semiconductor chip is a high-power diode. That is to say that the semiconductor chip has an electrical power consumption of at least one watt. Alternatively or additionally, the optical power of the radiation to be converted which is coupled into the conversion element is more than 100 mW, in particular more than 300 mW. With the use of a high-power diode, a compact construction can be realized by means of the conversion element, since the heat is dissipated efficiently from the conversion element.

In accordance with at least one embodiment of the illuminant, semiconductor chip and conversion element are arranged on a substrate configured as a heat sink.

Furthermore, a method for producing a conversion element described above is specified.

In accordance with at least one embodiment, the method comprises the following steps: providing a scattering layer and connecting the scattering layer to a conversion layer and a reflection layer.

In accordance with at least one embodiment of the method, provision is made for providing the scattering layer to comprise the following method steps: providing a first transparent carrier element having a wavelength-selective mirror layer, applying a liquid matrix material having a plurality of scattering elements to the first transparent carrier element, providing a second transparent carrier element having an antireflection layer, applying the second transparent carrier element to the liquid matrix material, and curing.

Optionally, holes can be provided in one of the carrier elements outside the region exposed to the primary radiation, in order to avoid air bubbles. Alternatively, air bubbles can also be introduced into the matrix material in a targeted manner, said air bubbles serving as scattering elements.

In accordance with at least one embodiment of the method, provision is made for providing the scattering layer to comprise the following method steps: providing a first transparent carrier element having an antireflection layer, applying a first dielectric, which contains in particular $SiO_2$, $Si_3N_3$, ITO, $TaO_5$, $Al_2O_3$, zirconium oxide or ZnO, wherein the dielectric has a rough surface or is subsequently roughened or structured, applying a second dielectric, planarizing the second dielectric, in particular by polishing, grinding or chemical mechanical polishing, and applying a wavelength-selective mirror layer.

The structuring of the first dielectric can be effected by means of a photomask or imprint technology, wherein diffraction gratings should preferably be avoided.

Alternatively, a plurality of the layer sequences described can also be arranged one on top of another. It is also possible to implement an epitaxial growth of the layers and a change in the growth mode between the layers from 3D growth to 2D growth. The method steps described can be performed in an isolated fashion or else in the opposite order.

At the surface of the conversion element, roughenings can additionally be arranged, for example needle-like points, which, as a result of multiple reflections, increase the coupling-in of the primary radiation and improve the coupling-out of the secondary radiation.

Some fields of application in which the conversion elements or illuminants described here could be used include, for instance, the illuminations of displays or display devices, in particular also in the automotive sector. Furthermore, the conversion elements and illuminants described here can also be used in lighting devices for projection purposes, in spotlights, in motor vehicle headlights or light emitters or in general lighting.

A conversion element described here and an illuminant described here are explained in greater detail below on the basis of exemplary embodiments with reference to the drawings. In this case, identical reference signs indicate identical elements in the individual figures. However, relations to scale are not illustrated here; rather, individual elements may be illustrated with an exaggerated size in order to afford a better understanding.

In the figures:

FIG. 1 shows a conversion element from the prior art,

FIG. 2 schematically shows a first exemplary embodiment of a conversion element, and FIGS. 3 to 6 show schematic detail views of the scattering layer of a conversion element in accordance with various exemplary embodiments.

FIG. 2 schematically illustrates a first exemplary embodiment of a conversion element 10. The conversion element comprises a scattering layer 12, a reflection layer 14, and a conversion layer 16 arranged between the scattering layer 12 and the reflection layer 14. The reflection layer 14 is arranged with its side facing away from the conversion layer 16 on a thermally conductive carrier 32. Moreover, an antireflection layer 30 is arranged on that side of the scattering layer 12 which faces away from the conversion layer 16.

A semiconductor chip 44 configured as a laser diode emits a primary radiation 18 having, for example, a wavelength of between 400 nm and 485 nm inclusive, which passes along an incidence direction 17 and impinges on the conversion element 10. The scattering layer 12 is designed to transmit a first portion 20 of the primary radiation 18 impinging on it from a side facing away from the conversion layer 16 into the conversion layer 16, and to scatter a second portion 22 of the primary radiation 18 impinging on it toward that side of the scattering layer 12 which faces away from the conversion layer 16, and in this case to deflect said portion into a finite, sufficiently large solid angle range.

The conversion layer 16 contains a transparent matrix material 24, for example silicone or a ceramic, in which at least one conversion means 25 is embedded. The conversion means 25, for example a cerium- or europium-containing luminescent substance, absorbs light in the UV or in the blue spectral range. By means of fluorescence, a re-emission of the conversion means 25 is effected at higher wavelengths, for example in the yellow or red spectral range, which results in the secondary radiation 19, which is identified by dashed arrows in FIG. 2. It is preferred for the scattered portion 22 of the primary radiation 18 and the secondary radiation 19 to cover a solid angle range of approximately identical magnitude toward that side of the scattering layer 12 which faces away from the conversion layer 16, such that mixed-colored light without color fringes is generated.

The reflection layer 14 has a reflective effect at least with regard to the secondary radiation 19 and is provided for reflecting secondary radiation 19 emitted toward the thermally conductive carrier 32 and thereby for coupling out said radiation from the conversion element 10.

FIG. 3 schematically illustrates a detailed view of the scattering layer 12 of the first exemplary embodiment of the conversion element 10. In this case, the scattering layer contains a transparent matrix material 26, for example silicone, in which a plurality of scattering elements 28 embodied in a spherical fashion are embedded, the average size of which is greater than a wavelength of the primary radiation 18, in order to obtain radiation lobes principally parallel and antiparallel with respect to the incidence direction 17.

The scattering elements 28 can be reflection-coated, for example with silver. By means of the non-planar surface of the reflection-coated scattering elements 28, a specific portion of the primary radiation 22 is reflected into a finite, sufficiently large solid angle range toward a side of the scattering layer 12 which faces away from the conversion layer 16, and is thereby scattered within the meaning of the definition mentioned in the general part.

The scattering elements 28 can, on the other hand, have for example a refractive index which differs from that of the matrix material 26 of the scattering layer 12. In this regard, by way of example, the difference in the optical refractive index between scattering elements 28 and matrix material 26 can be greater than or equal to 0.1, preferably greater than or equal to 0.2, in particular greater than or equal to 0.4. Depending on whether the scattering elements 28 have a lower or higher refractive index than the matrix material 26, a reflection of the primary radiation 18 takes place on the outer or inner side of the scattering elements 28. By means of the non-planar outer or inner side of the scattering elements 28, a specific portion of the primary radiation 22 is reflected into a finite, sufficiently large solid angle range toward a side of the scattering layer 12 which faces away from the conversion layer 16, and is thereby scattered within the meaning of the definition mentioned in the general part.

In a second exemplary embodiment (not illustrated), a wavelength-selective, dielectric mirror layer is arranged between the conversion layer 16 and the scattering layer 12 and has a partly reflective effect for the primary radiation and a transmissive effect for the secondary radiation. By way of example, between 10% and 50% of the intensity of the primary radiation 18 can be reflected by the wavelength-selective mirror layer. In this case, the wavelength-selective mirror layer at least partly defines the scattered portion 22 of the primary radiation.

FIG. 4 schematically illustrates a detailed view of the scattering layer 12 of a third exemplary embodiment of the conversion element 10. In this case, the scattering layer 12 comprises a first and a second partial layer 34, 36 having mutually different refractive indices, wherein the interface between the first and second partial layers 34, 36 is roughened. This gives rise to a plurality of partial areas which are inclined with respect to a main extension plane of the partial layers 34, 36 and form a plurality of different angles therewith. A wavelength-selective, dielectric mirror layer 42 is arranged between the conversion layer 16 and the second partial layer 36 and has a partly reflective effect for the primary radiation 18 and a transmissive effect for the secondary radiation 19. By way of example, once again between 10% and 50% of the intensity of the primary radiation 18 can be reflected by the wavelength-selective mirror layer 42. If primary radiation 18 impinges on the interface between the first and second partial layers 34, 36, then the primary radiation 18 is refracted at different angles and impinges on the wavelength-selective mirror layer 42 at such angles. Said wavelength-selective mirror layer reflects a specific portion of the partial beams back to the interface between the first and second partial layers 34, 36, where they are refracted again at different angles. Finally, the partial beams are emitted into a finite, sufficiently large solid angle range toward that side of the scattering layer which faces away from the conversion layer 16. Consequently, the combination of the first and second partial layers 34, 36 and of the wavelength-selective mirror layer 42 acts as a scattering layer in accordance with the definition mentioned in the general part.

FIG. 5 schematically illustrates a detailed view of the scattering layer 12 of a fourth exemplary embodiment of the conversion element 10, which differs from the third exemplary embodiment in that the first and second partial layers 34, 36 have mutually complementary, regular structurings 38, 40, which can be embodied in a comb-like fashion, for example.

FIG. 6 schematically illustrates a detailed view of the scattering layer 12 of a fifth exemplary embodiment of the conversion element 10, which differs from the third exemplary embodiment in that the second partial layer 36 itself is embodied in the form of the wavelength-selective mirror layer 42.

As a result of the roughening, the wavelength-selective mirror layer 42 has a plurality of partial areas which are inclined with respect to a main extension plane of the wavelength-selective mirror layer 42 and form a plurality of different angles therewith. As described in the general part, the wavelength-selective mirror layer 42 thereby acts as a scattering layer in accordance with the definition mentioned in the general part.

The invention is not restricted to the exemplary embodiments by the description on the basis of said exemplary embodiments. Rather, the invention encompasses any novel feature and also any combination of features, which in particular includes any combination of features in the patent claims, even if this feature or this combination itself is not explicitly specified in the patent claims or exemplary embodiments.

The invention claimed is:

1. A conversion element comprising:
   a scattering layer;
   a reflection layer; and
   a conversion layer arranged between the scattering layer and the reflection layer,
   wherein
   the scattering layer is designed to transmit a first portion of a primary radiation impinging on the scattering layer from a side facing away from the conversion layer into the conversion layer, and to scatter a second portion of the primary radiation impinging on the scattering layer toward that side of the scattering layer which faces away from the conversion layer,
   the conversion layer comprises at least one conversion means which is designed to convert at least part of the first portion of the primary radiation into a secondary radiation having a higher wavelength different from the primary radiation,
   the reflection layer has a reflective effect at least with regard to the secondary radiation, and
   the scattering layer comprises a wavelength-selective mirror layer, which has a partly reflective effect for the primary radiation and a transmissive effect for the secondary radiation, and
   the scattering layer comprises first and second partial layers, wherein the second partial layer itself is embodied as the wavelength-selective mirror layer and has a plurality of partial areas which are inclined with respect to a main extension plane of the wavelength-selective mirror layer and form a plurality of different angles therewith, and
   the wavelength-selective mirror layer is arranged between the first partial layer of the scattering layer and the conversion layer.

2. The conversion element according to claim 1, wherein the wavelength-selective mirror layer is adapted to reflect between 10% and 50% of intensity of the primary radiation.

3. A conversion element comprising:
   a scattering layer;
   a reflection layer;
   a wavelength-selective mirror layer; and
   a conversion layer arranged between the scattering layer and the reflection layer,
   wherein
   the scattering layer is designed to transmit a first portion of a primary radiation impinging on the scattering layer from a side facing away from the conversion layer into the conversion layer, and to scatter a second portion of the primary radiation impinging on the scattering layer toward that side of the scattering layer which faces away from the conversion layer,
   the conversion layer comprises at least one conversion means which is designed to convert at least part of the first portion of the primary radiation into a secondary radiation having a higher wavelength different from the primary radiation,
   the reflection layer has a reflective effect at least with regard to the secondary radiation,
   the scattering layer comprises a first and a second partial layer having mutually different refractive indices,
   a common interface between the first and second partial layers is roughened so that the first and second partial layers have mutually complementary structurings,
   the wavelength-selective mirror layer is arranged between the second partial layer of the scattering layer and the conversion layer, and
   the wavelength-selective mirror layer has a partly reflective effect for the primary radiation and a transmissive effect for the secondary radiation.

4. The conversion element according to claim 3, wherein the scattering layer comprises a wavelength-selective mirror layer, which has a partly reflective effect for the primary radiation and a transmissive effect for the secondary radiation.

5. The conversion element according to claim 4, wherein the wavelength-selective mirror layer is arranged between the scattering layer and the conversion layer.

6. The conversion element according to claim 4, wherein the wavelength-selective mirror layer has a plurality of partial areas which are inclined with respect to a main extension plane of the wavelength-selective mirror layer and form a plurality of different angles therewith.

* * * * *